(12) United States Patent
Wenger et al.

(10) Patent No.: US 7,779,336 B2
(45) Date of Patent: Aug. 17, 2010

(54) ASSEMBLING FORWARD ERROR CORRECTION FRAMES

(75) Inventors: Stephan Wenger, Tampere (FI); Miska Hannuksela, Ruutana (FI)

(73) Assignee: Nokia Corporation, Espoo (FI)

( * ) Notice: Subject to any disclaimer, the term of this patent is extended or adjusted under 35 U.S.C. 154(b) by 627 days.

(21) Appl. No.: 11/244,858

(22) Filed: Oct. 5, 2005

(65) Prior Publication Data

US 2006/0107189 A1 May 18, 2006

(30) Foreign Application Priority Data

Oct. 6, 2004 (WO) ................. PCT/IB2004/003258

(51) Int. Cl.
*H03M 13/00* (2006.01)
(52) U.S. Cl. .................... 714/776; 714/752; 714/755
(58) Field of Classification Search ................. 714/776, 714/752, 755
See application file for complete search history.

(56) References Cited

U.S. PATENT DOCUMENTS

| | | | |
|---|---|---|---|
| 5,889,791 A * | 3/1999 | Yang ........................... 714/752 |
| 5,991,912 A * | 11/1999 | Mao ............................ 714/776 |
| 6,075,545 A | 6/2000 | De Bonet et al. |
| 6,141,788 A | 10/2000 | Rosenberg et al. |
| 6,317,462 B1 * | 11/2001 | Boyce .................... 375/240.27 |
| 6,400,720 B1 * | 6/2002 | Ovadia et al. .......... 370/395.64 |
| 6,609,223 B1 | 8/2003 | Wolfgang |
| 6,675,340 B1 * | 1/2004 | Hardie et al. ................ 714/751 |
| 6,678,855 B1 | 1/2004 | Gemmell |
| 6,745,364 B2 | 6/2004 | Bhatt et al. |
| 6,757,851 B1 * | 6/2004 | Park et al. ...................... 714/48 |
| 6,980,567 B1 * | 12/2005 | Markevitch et al. ......... 370/474 |
| 7,043,671 B2 * | 5/2006 | Bader et al. .................. 714/701 |
| 7,139,966 B2 * | 11/2006 | Litwin et al. ................. 714/776 |

(Continued)

FOREIGN PATENT DOCUMENTS

EP 0996291 4/2000

OTHER PUBLICATIONS

"An RTP Payload Format for Generic Forward Error Correction;" J. Rosenberg et al; RFC 2733; Dec. 1999.
"The Case for FEC-Based Error Control for Packet Audio in the Internet;" Jean-Chrysostome Bolot et al; www-sop.inria.fr/rodeo/personnel/avega/papers/mmsys97; retrieved from the Internet Oct. 2005.

*Primary Examiner*—Scott Baderman
*Assistant Examiner*—Sam Rizk
(74) *Attorney, Agent, or Firm*—Alfred A. Fressola; Ware, Fressola, Van Der Sluys & Adolphson LLP (57) ABSTRACT

The invention relates to a method for assembling FEC frames for a sequence of groups of coded media packets. In order to reduce a buffer delay at a decoding end (15), it is proposed that the FEC frame is aligned with the groups of media packets. To this end, a number of next subsequent groups are determined, which fit completely into a FEC frame. All coded media packets associated to this determined group or groups, if any, are selected for the FEC frame (step 202,402). Then, the selected coded media packets are encoded to obtain at least one FEC packet for the FEC frame (step 206,406). For fixed FEC frame structures, moreover the introduction of padding packets as additional media packets, if required, is proposed.

18 Claims, 5 Drawing Sheets

U.S. PATENT DOCUMENTS

| | | | |
|---|---|---|---|
| 7,155,657 B2 * | 12/2006 | Bordes et al. | 714/774 |
| 7,321,602 B2 * | 1/2008 | Bae et al. | 370/528 |
| 7,472,334 B1 * | 12/2008 | Scott et al. | 714/785 |
| 7,533,324 B2 * | 5/2009 | Fischer et al. | 714/776 |
| 2001/0053141 A1 | 12/2001 | Periyalwar | |

* cited by examiner

ASSEMBLING FORWARD ERROR CORRECTION FRAMES

CROSS REFERENCE TO RELATED APPLICATION

This application claims priority under 35 USC §119 to International Patent Application No. PCT/IB04/003258 filed on Oct. 6, 2004.

FIELD OF THE INVENTION

The invention relates to a method, a processing module, an electronic device, a software code and a software program product for assembling forward error correction frames for a sequence of groups of coded media packets. The invention further relates to a communication system enabling an assembly of forward error correction frames.

BACKGROUND OF THE INVENTION

Most packet based communication networks, especially Internet Protocol (IP) networks without guaranteed quality of service, suffer from a variable amount of packet losses or errors. Those losses can stem from many sources, for example router or transmission segment overload or bit errors in packets that lead to their deletion. It should be understood that packet losses are a common operation point in most packet networks architectures, and not a network failure.

Media transmission, especially the transmission of compressed video, suffers greatly from packet losses.

Means to improve the quality of a packet based channel have been reported early. Re-transmission based mechanisms can ensure error free channels at the cost of undefined delay. This, however, is not desirable for streaming and conversational applications.

Annoying artifacts in a media presentation resulting from errors in a media transmission can further be avoided by many different means during the media coding process. However, adding redundancy bits during a media coding process is not possible for pre-coded content, and is normally less efficient than optimal protection mechanisms in the channel coding using a forward error correction (FEC).

Forward Error Correction works by calculating a number of redundant bits over the to-be-protected bits in the various to-be-protected media packets, add those bits to FEC packets, and transmit both, the media packets and the FEC packets. At the receiver, the FEC packets can be used to check the integrity of the media packets and to reconstruct media packets that may be missing. Henceforth, the media packets and the FEC packets which are protecting those media packets will be called a FEC frame.

Most FEC schemes intended for error protection allow selecting the number of to-be-protected media packets and the number of FEC packets to be chosen adaptively to select the strength of the protection and the delay constraints of the FEC subsystem. Generally speaking, the more bits are spent to achieve a required protection strength, the lower a delay can result. Variable FEC frame sizes are dealt with for example in the specification RFC 2733: "An RTP Payload Format for Generic Forward Error Correction", December 1999, or in the U.S. Pat. No. 6,678,855.

Packet based FEC in the sense discussed above requires a synchronization of the receiver to the FEC frame structure, in order to take advantage of the FEC. That is, a receiver has to buffer all media and FEC packets of a FEC frame before error correction can commence.

Video coding schemes, and increasingly some audio coding schemes, for example, use so-called predictive coding techniques. Such techniques predict the content of a later video picture or audio frame from previous pictures or audio frames, respectively. In the following, video pictures and audio frames will both be referred to as "pictures", in order to distinguish them from FEC frames. By using predictive coding techniques, the compression scheme can be very efficient, but becomes also increasingly vulnerable to errors the longer the prediction chain becomes. Hence, so-called key pictures, or the equivalent of non-predictively coded audio frames— both referred to as key pictures henceforth, are inserted from time to time, that re-establish the integrity of the prediction chain by using only non-predictive coding techniques. Some alternative mechanisms avoid the use of key pictures in favor of guaranteed refresh times using only predictively coded pictures. In the scope of this document, this so-called gradual decoder refresh mechanism is essentially the same as a key picture. It is not uncommon that a key pictures is 5 to 20 times bigger than a predictively coded picture. Each encoded picture may correspond for example to one to-be-protected media packet.

Following the conventions of MPEG-2 visual, the picture sequence starting with a key picture and followed by zero or more non-key pictures is henceforth called Group of Pictures (GOP). In digital TV, a GOP consists normally of no more than six pictures. The key reason for such short GOPs is primarily the delay constraints when switching TV channels: since meaningful decoding can only start at a key picture, a decoder, on average, has to wait half of the transmission time of the bits of a GOP before it can start decoding a meaningful key picture. In streaming applications, GOP sizes are often chosen much bigger—some one hundred pictures in a GOP are not unusual—in order to take advantage of the better coding efficiency of predictively coded pictures. Hence the "tune in" to such a sequence can take several seconds.

FEC schemes can be designed to be more efficient when FEC frames are big in size, for example when they comprise some hundred packets. Similarly, most media coding schemes gain efficiency when choosing larger GOP sizes, since a GOP contains only one single key picture which is, statistically, much larger than the other pictures of the GOP.

However, both large FEC frames and large GOP sizes require to synchronize to their respective structures. For FEC frames this implies buffering of the whole FEC frame as received, and correcting any correctable errors. For media GOPs this implies the parsing and discarding of those media packets that do not form the start of a GOP (the key frame).

This not only requires a significant amount of buffering memory, but also buffering time. In conventional systems, where FEC decoding and media decoding is implemented independently, the average delay at tune-in is 1.5 dFEC+0.5 dMedia, where dFEC is the buffering delay of the FEC frame (in isochronous networks this is proportional to the size of the FEC frame), and dMedia is the buffering delay of the media GOP. The worst case buffer sizes have to be chosen such that a complete FEC frame and a complete GOP, respectively, fits into the buffer of an FEC decoder and the buffer of a media decoder, respectively.

SUMMARY OF THE INVENTION

It is an object of the invention to improve a FEC coding for grouped media packets.

For a first aspect of the invention, a method for assembling FEC frames for a sequence of groups of coded media packets is proposed. The method comprises for a case where no remaining coded media packets of a group of coded media packets partly included in a preceding FEC frame still have to be included in a FEC frame:

determining a number of next subsequent groups of coded media packets which fit completely into a FEC frame and selecting all coded media packets associated to the determined group or groups of coded media packets, if any, for the FEC frame; and encoding the selected coded media packets to obtain at least one FEC packet for the FEC frame.

The "next subsequent groups" are respectively those subsequent groups which follow immediately upon a group of which media packets have been included at least partly in a preceding FEC frame. At the beginning of a processing, the next subsequent groups start off with the first group of coded media packets.

Moreover, a FEC frame generator for assembling FEC frames for a sequence of groups of coded media packets is proposed. For a case where no remaining coded media packets of a group of coded media packets partly included in a preceding FEC frame still have to be included in a FEC frame, the FEC frame generator is adapted to determine a number of next subsequent groups of coded media packets which fit completely into a FEC frame and to select all coded media packets associated to the determined group or groups of coded media packets, if any, for the FEC frame. The FEC frame generator is further adapted to encode selected coded media packets to obtain at least one FEC packet for the FEC frame. The FEC frame generator can be realized for example by hardware or by a processing component running a corresponding software.

Moreover, an electronic device is proposed which comprises the proposed FEC frame generator. Such a device can be any device which has to apply an FEC encoding on grouped media data, like, for example, a streaming server.

Moreover, a software code for assembling FEC frames for a sequence of groups of coded media packets is proposed. When running in a processing component, the software code realizes the steps of the proposed method.

Moreover, a software program product is proposed, which stores the proposed software code.

Finally, a communication system is proposed, which comprises at least one FEC frame generator as proposed and at least one FEC decoder. The FEC decoder should be adapted to decode the FEC frames provided by the FEC frame generator.

The invention proceeds from the consideration that a synchronization of FEC frames and groups of media packets to their respective structures can be accelerated, if the FEC frames are aligned to the groups of media packets. It is therefore proposed that, whenever possible, exclusively the media packets of an entire number of groups is used in a respective FEC frame.

It is an advantage of the invention that it reduces a buffering delay when tuning-in to a particular sequence of groups of encoded media packets. In case a decoding end can rely on that the invention is used by an encoding end, it is further an advantage of the invention that it reduces the buffer size requirements at the decoding end.

For a case where remaining coded media packets of a group of coded media packets partly included in a preceding FEC frame still have to be included in a FEC frame, a similar approach may be used, if all of the remaining coded media packets fits into a single FEC frame. More specifically, a number of next subsequent groups of coded media packets may be determined, which fit in addition to the remaining coded media packets completely into a FEC frame. The remaining coded media packets and the coded media packets associated to the determined group or groups of coded media packets, if any, is then selected for the FEC frame. Further, the selected coded media packets are encoded to obtain at least one FEC packet for the FEC frame.

That is, even though in this FEC frame, an alignment to the groups of encoded media data is not possible, it is ensured, that such an alignment can be achieved again with the next FEC frame.

For a case where even a single next group of coded media data does not fit completely into a FEC frame or that all remaining coded media packets of a group of coded media data partly included already in a preceding FEC do not fit into a single FEC frame, the FEC can only be filled up as far as possible with coded media packets. Thus, a maximum number of next subsequent coded media packets is determined, which fit completely into a FEC frame, and this determined coded media packets are selected for the FEC frame. The selected coded media packets are then encoded to obtain at least one FEC packet for the FEC frame.

In one embodiment of the invention, for the encoding, all selected coded media packets are supplemented to be of the same size as the largest one of the selected coded media packets. To this end, predetermined data is added to media data included in the selected coded media packets. Moreover, each of the obtained at least one FEC packet has a size corresponding to the size of the largest one of the selected coded media packets.

In one embodiment of the invention, the supplementation of selected coded media packets is only performed for the purpose of encoding, to obtain the FEC packets based on equal sized media packets, though. If an assembled FEC frame is to be transmitted, all selected coded media packets are transmitted with the original size of included media data. By transmitting the original coded media packets, the burden on a transmission network is minimized. The coded media packets could moreover include an indication of a size of originally included media data, which can then be checked at a receiving end.

The number of packets belonging to a FEC frame can be either fixed or adjustable.

In one embodiment of the invention, the number of packets belonging to a FEC frame is adjustable, and the number is adjusted based on the number of the selected coded media packets. That is, if only a few media packets are selected, the number of packets in the FEC frame may be smaller than if a large number of media packets is selected. Further, the number of FEC packets which are to be obtained in the encoding may be selected such that a resulting size of an FEC frame lies above a predetermined minimum size for an FEC frame and below a predetermined maximum size for an FEC frame.

In another embodiment of the invention, the number of coded media packets within a FEC frame is fixed to a first predetermined number and the number of FEC packets within a FEC frame is fixed to a second predetermined number. In case the number of the selected coded media packets is lower than the first predetermined number, packets comprising padding values as media data in a payload are added to obtain the first predetermined number of coded media packets for the FEC frame which are required for the encoding. For a transmission of such an FEC frame, the packets comprising padding values may be replaced by virtual padding packets having a payload length of zero bytes and indicating only a size of the media data including the padding values in a payload header. If the to be employed padding values are known at both, encoding end and decoding end, the decoding end will known only from the indicated size of the media data including the padding values, which padding values should be actually used.

According to a second aspect of the invention, the latter embodiment can also be used independently of the first aspect of the invention.

Therefore, in addition a method for assembling FEC frames with coded media packets and at least one FEC packet is proposed, wherein the number of coded media packets within a FEC frame is fixed to a first predetermined number and wherein the number of FEC packets within a FEC frame is fixed to a second predetermined number. The method comprises in case the number of the coded media packets is lower than the first predetermined number, adding packets comprising padding values as media data in a payload to obtain the first predetermined number of coded media packets for the forward error correction frame. This method further comprises encoding the coded media packets to obtain the at least one FEC packet.

As already mentioned, for a transmission of the FEC frame, the packets comprising padding values may be replaced by virtual padding packets having a payload length of zero bytes and indicating a size of the media data including the padding values in a payload header.

For the second aspect of the invention, moreover, a FEC frame generator for assembling FEC frames with coded media packets and at least one FEC packet is proposed, wherein the number of coded media packets within a FEC frame is fixed to a first predetermined number and wherein the number of FEC packets within a forward error correction frame is fixed to a second predetermined number. This FEC frame generator is adapted to perform the steps of the method according to the second aspect of the invention.

For the second aspect of the invention, moreover an electronic device is proposed, which comprises such a FEC frame generator. Equally, a communication system is proposed, which comprises at least one such FEC frame generator and at least one FEC decoder.

For the second aspect of the invention, moreover a software code for assembling forward error correction frames with coded media packets and at least one forward error correction packet is proposed, wherein the number of coded media packets within a forward error correction frame is fixed to a first predetermined number and wherein the number of forward error correction packets within a forward error correction frame is fixed to a second predetermined number. When running in a processing module, the software code realizes the steps of the method according to the second aspect of the invention.

For the second aspect of the invention, finally, a software program product storing such a software code is proposed.

BRIEF DESCRIPTION OF THE FIGURES

Other objects and features of the present invention will become apparent from the following detailed description considered in conjunction with the accompanying drawings.

DETAILED DESCRIPTION OF THE INVENTION

Figure 1:
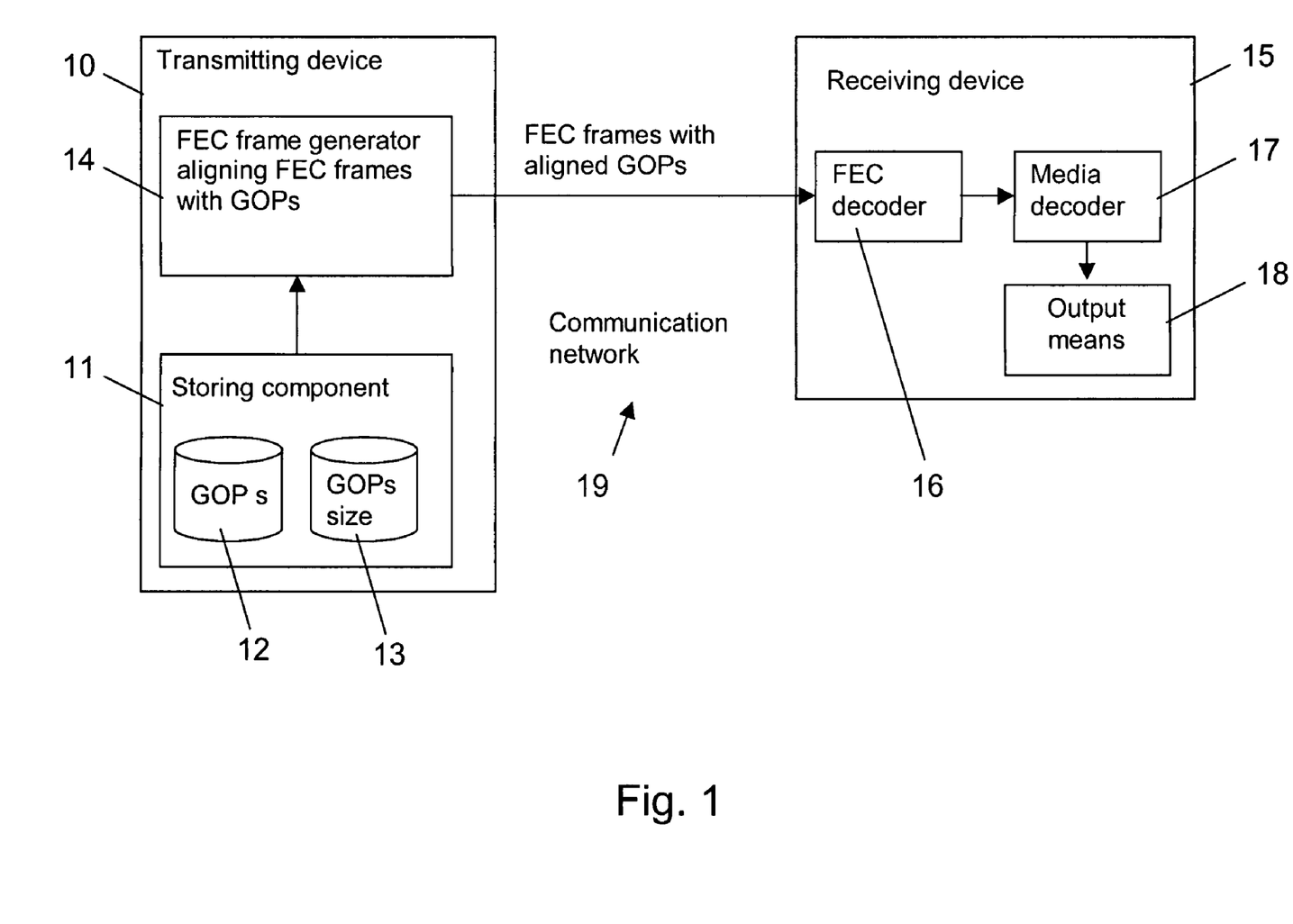
FIG. 1 is a schematic diagram of a communication system according to an embodiment of the invention.

FIG. 1 is a schematic diagram of an exemplary communication system, in which FEC frames are aligned to groups of media packets in accordance with the invention.

The communication system comprises a transmitting device 10 and a receiving device 15, which are able to communicate with each other via a communication network 19, for example the Internet.

The transmitting device 10 can be for example a streaming server providing audio and/or video data for transmission via the communication network 19. It comprises a storage component 11 which stores pre-coded media GOPs in a file 12, each GOP comprising a plurality of coded media packets. Each GOP forms thus a group of coded media packets in accordance with the invention. In addition, the storage component 11 stores a file 13 containing information about the size of each stored pre-coded GOP. It is to be understood that this second file does not necessarily have to be in the form of an individual file in a file system. It could also, for example, be implemented in the form of a hint-track or an algorithm that parses the first file and identifies the GOP boundaries and calculates the size of each GOP. Persons skilled in the art should see other possibilities as well.

The transmitting device 10 further comprises a FEC frame generator 14. The FEC frame generator 14 can be for example a processing component running a FEC encoding software.

The receiving device 15 can be for example a home PC which is used by a user for requesting audio and/or video data via the communication network 19 from a streaming server. The receiving device 15 comprises a FEC decoder 16, a media decoder 17 and output means 18, for example a screen or a loudspeaker. The FEC decoder 16 may be for example a processing component running a FEC decoding software code, and the media decoder 17 may be for example the same or another processing component running a media decoding software code.

For a streaming session, the GOPs and the size information of the GOPs are forwarded by the storing component 11 to the FEC frame generator 14. The FEC frame generator 14 generates FEC frames out of the provided information in such a way that the boundaries of the FEC frames are aligned, whenever possible, to the boundaries of the GOPs, as will be described in more detail further below.

The resulting FEC frames are transmitted through the communication network 19 to the receiving device 15. In the receiving device 15, the FEC decoder 16 reconstructs, if possible, eventually missing coded media data packets, and forwards the coded media packets to the media decoder 17. The media decoder 17, ultimately, generates the uncompressed media data ready for a presentation to a user via the output means 18.

In the following, the operation of the FEC frame generator 14 of the transmitting device 10 will be presented for two different, exemplary embodiments of the invention.

In both embodiments, the FEC frame generator 14 operates on an application layer and applies to the received GOPs a packet based Reed-Solomon FEC scheme in an IP/UDP/RTP protocol structure, that is implemented as an RTP payload format. In a Reed-Solomon FEC scheme, K media packets are protected by N-K FEC packets to form an FEC frame of N packets. Both, the media packets and the FEC packets, are conveyed in a single RTP session, the RTP payload type being used at a receiving end to differentiate media packets from FEC packets.

At the receiving device 15, a FEC frame can be identified by observing the RTP payload type and the sequence numbers of received RTP packets: Each FEC frame comprises K media packets (starting with sequence number s), and N-K FEC packets (starting with sequence number s+K).

The structure of the FEC frame for which a Reed-Solomon is employed, that is the values K and N, can be fixed or variable.

Figure 2:
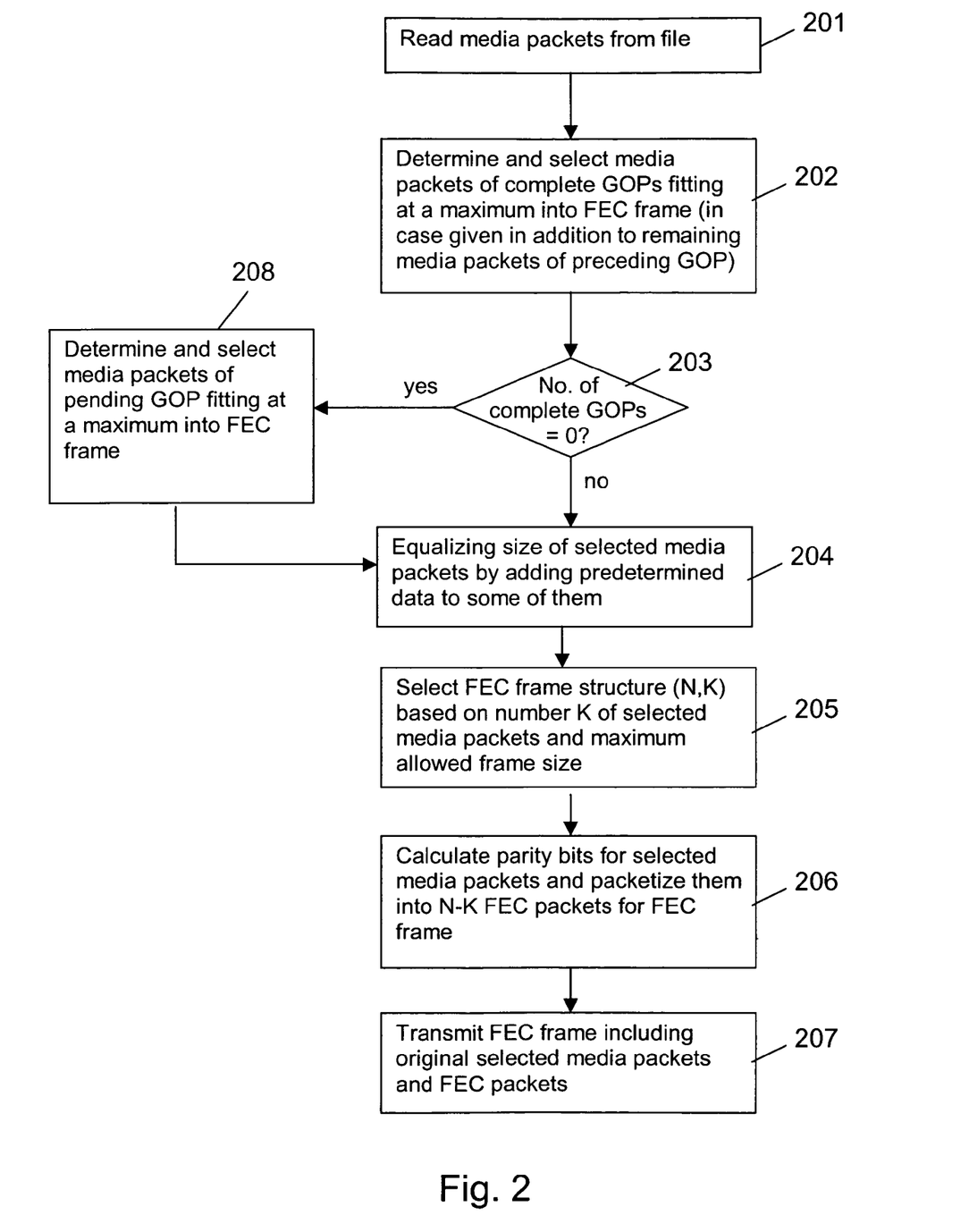
FIG. 2 is a flow chart illustrating a forward error correction encoding in the system of FIG. 1 in accordance with a first embodiment of the invention.

FIG. 2 is a flow chart illustrating an operation by the FEC frame generator 14 of the transmitting device 10 according to the first exemplary embodiment of the invention. In this embodiment, the FEC frame generator 14 is able to use variable FEC frame structures.

The FEC frame generator 14 first reads the pre-coded GOP media packets and associated GOP size information from files 12, 13 in the storage component 11 (step 201).

The FEC frame generator 14 has a knowledge of a minimum and a maximum allowed size of a FEC frame, which are desirable from an application and network statistics point-of-view.

Based on the GOP size information, the FEC frame generator 14 selects the media packets of one or more complete GOPs, which fit into an FEC frame which is limited in size by the maximum frame size (step 202).

If media packets of at least one entire GOP fit into an FEC frame (step 203), the FEC frame generator 14 equalizes the size of all selected media packets (step 204), if required.

The reason for the equalization is that it is highly unlikely that pre-recorded media packets are of identical size. For the FEC encoding, however, K media packets of equal size are required for obtaining N-K FEC packets of the same size. Let X be the size of the media data, measured for example in bytes, of a given media packet that is part of a given FEC frame. Let Xmax be the largest X of all media packets of the given FEC frame. For the FEC calculations, Xmax bytes are considered to be the media data, where, for example, the last Xmax-X bytes of the media data carry a predetermined constant value, for example zero. For the preceding equalization, such predetermined constant values are added to all selected media packets which do not have the maximum size Xmax.

If the reconstruction of all data of a packet is desired in case of an error in that packet, which can usually be assumed, the size of the media data is put into the RTP payload header of each media packet, which is—in contrast to for example the IP header—protected by the FEC. The size of the entire media packet, including its various headers such as, for example, IP, UDP and RTP payload headers, can be signaled in other packet headers, for example in the IP header.

Next, the FEC frame generator 14 selects the precise structure of the FEC frame based on the allowed minimum and maximum size for an FEC frame (step 205). The number of media packets K is already determined by the identified number of media packets necessary for the transmission of the next GOP or GOPs. Further, the size of any packet in the frame is given by the largest selected media packet. Thus, the FEC frame generator 14 still has to select the number of FEC frames (N-K).

Then, the FEC frame generator 14 constructs FEC frame of the determined number by calculating the redundant parity bits of the appropriate FEC scheme and by packetizing those bits into (N-K) FEC packets (step 206). The values K and N are included in a header field of each FEC packet for an in-band signaling.

By following this process, it is ensured that the first media packet of an FEC frame contains the first packet of a GOP.

The FEC frame is then transmitted via the communication network 19 to the receiving device 15 (step 207).

In this transmitted FEC frame, however, only the original X media bytes and the packet headers are send for each media packet. The value Xmax does not have to be signaled. Since all FEC packets are of the size Xmax plus the size of the various headers, Xmax is known at a receiving end if a single FEC packet of the FEC frame is received. If all FEC packets of a frame are lost in transmission, then it is impossible to reconstruct any lost media packets. Hence only the received media packets can be used for eventual reconstruction anyhow, and their size information is known.

The described FEC encoding process can then be continued for the next FEC frame with step 201.

If it is detected in some iteration that the media packets of the next GOP do not fit entirely into an FEC frame (step 203), the FEC frame generator 14 selects those media packets of the next GOP which fit at a maximum into the FEC frame (step 208). These selected media packets are then processed in steps 204 to 207 as described above.

For the subsequent FEC frame generated in the next iteration, this means that it cannot be ensured that the first media packet of the FEC frame contains the first packet of a GOP. However, this does not add any additional delay or buffering requirements compared to a conventional approach.

For this subsequent frame, in step 202 a number of media packets of complete GOPs is selected, which fits at a maximum in addition to remaining media packets of a preceding GOP into an FEC frame.

If media packets of at least one next GOP fit entirely into an FEC frame (step 203), steps 204 to 207 are carried out as described above, and the alignment is re-established for the FEC frame constructed in the next iteration.

If media packets of at least one next GOP do not fit entirely into an FEC frame (step 203), all remaining media packets of the previous GOP are selected, which fit at a maximum into the FEC frame, which may but do not have to be all of the remaining media packets of the previous GOP (step 208). Then, steps 204 to 207 are carried out as described above. In this case, the alignment will be re-established at the earliest in the next but one iteration.

Figure 3:
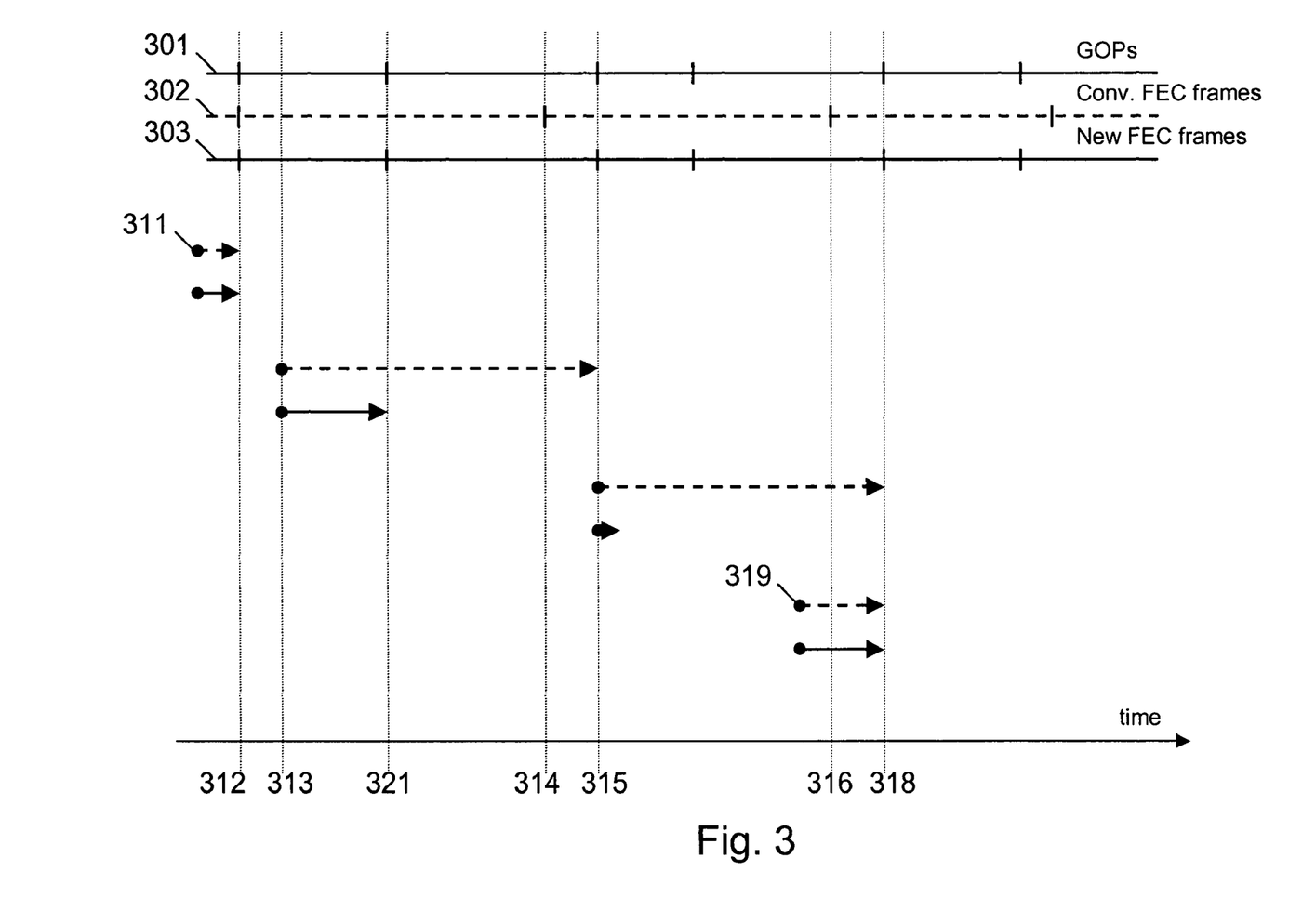
FIG. 3 is a time diagram illustrating differences in a synchronization delay when using a conventional assembly of forward error correction frames and when using the assembly of forward error correction frames according to FIG. 2.

FIG. 3 is a timing diagram including a time line, comparing a tune-in delay achieved with a conventional FEC encoding and a tune-in delay achieved with the FEC encoding as presented in FIG. 2.

A first horizontal line 301 represents a media GOP structure. Small vertical lines indicate the boundaries between different GOPs. As can be seen, the GOP structure is variable in size and, assuming a constant transmission bandwidth, variable in time, as it is in practice. It should be noted, however, that the invention does not require a variable GOP size; it is depicted as variable here for illustration purposes only.

A dashed second horizontal line 302 represents FEC frames, as used in prior art designs. Small vertical lines indicate the boundaries between different FEC frames. For simplicity, the FEC frames are depicted to be constant in size, and hence in transmission time when assuming the same constant bandwidth link. It has to be noted, though, that they could in fact be variable in size as well.

A third horizontal line 303 represents FEC frames, as used in the approach presented with reference to FIG. 2. Small vertical lines indicate the boundaries between different FEC frames.

In addition, the duration for the synchronization of both FEC decoder 16 and media decoder 17 is marked in four examples on the one hand for the conventional FEC frames 302 and on the other hand when proceeding from FEC frames in accordance with the invention 303. In all four cases, a respective arrow indicates the synchronization time between a tune-in-point and a time of synchronization. For the conventional approach, the arrows are depicted with dashed lines, while for the presented approach, the arrows are depicted with solid lines.

It has to be noted in general that first, a synchronization in the FEC decoder 16 has to be achieved, that is, the FEC decoder 16 has to detect the beginning of a new FEC frame. Only then, a synchronization in the media decoder 17 can be started in order to detect the beginning of a new GOP. The synchronization may also occur simultaneously.

First, the delays resulting in the four situations with a conventional approach will be described.

In a first situation, the synchronization can be reached in a very short time from a tune-in-point 311, because the start of a FEC frame and the start of a media frame are aligned here. The synchronization is reached at the time-line 312. This particular situation is common in current designs primarily at the startup of a connection.

In a second situation, a tune-in into a connection is performed at a later time. Here the tune-in point is in the middle of a conventional FEC frame and in the middle of a media packet, as the corresponding time-line 313 shows. In order to reach synchronization of both decoders 16, 17 of a receiving device 15, first the FEC decoder 16 has to find synchronization. This synchronization can only be achieved at timeline 314. Only thereafter, the media decoder 17 can try to find alignment, and finds it finally at timeline 315.

In a third situation, a tune-in point that is located exactly on the boundary of two GOPs of the media coder, as can be seen in timeline 315. Nevertheless, the system has first to align with the FEC decoder 16 at timeline 316, and only then can start synchronizing with the media decoder 17. It reaches synchronization at timeline 318.

In a fourth situation, a tune-in point 319 is located, as in the second situation, in the middle of both a FEC frame and a media GOP. Nevertheless, the synchronization is achieved quickly, because both the synchronization point for the FEC decoder 16 at time line 316 and the synchronization point for the media decoder 17 at time line 318 are not far ahead in time and occur in the correct sequencing, namely, first FEC and then media.

To summarize, in the illustrated first and the fourth situation, the combined synchronization occurs relatively quickly, but in the illustrated second and third situation, it takes a long time.

In the FEC structure 303, the boundaries of the FEC frames have been aligned with the boundaries of the media GOPs 301 in accordance with the invention.

In the first situation, the tune-in delay remains the same with the proposed FEC frame structure 303 as with the conventional FEC frame structure 302, because the conventional FEC structure 302 and the media structure 301 were aligned as well by chance.

However, in the second situation, the aligned FEC structure 303 leads to a significantly lower tune-in delay at timeline 321.

In the third situation, which resulted also in a very long tune-in delay in the prior art design, the tune-in delay is reduced to zero with the aligned FEC structure 303.

Only in the fourth situation, there is no change in the tune-in delay, even though the FEC frame of FEC frame structure 302 at time line 316 is not aligned with the media packet of GOP structure 301 at time line 318, in contrast to the FEC frame of FEC frame structure 303 which is equally arranged at time line 318.

The approach according to the invention thus allows reducing the tune-in delays by forcing the streaming server 10 to align the FEC frame structure 303 to the media GOP structure 301. This often results in a reduced tune-in delay, sometimes the tune-in delay remains constant, and never it increases.

It has to be noted that in practice, the FEC decoder 16 first has to decode the entire FEC frame before the media coder 17 can start a synchronization with the media packets from the decoded FEC frame. For reasons of clarity, however, this has been neglected in the presentation in FIG. 3. For an absolute precise presentation, the decoding time would thus have to be shifted by one FEC frame to the past. Actually, this would make the scheme even more efficient because, on average, smaller FEC frames will be selected by the algorithm.

Figure 4:
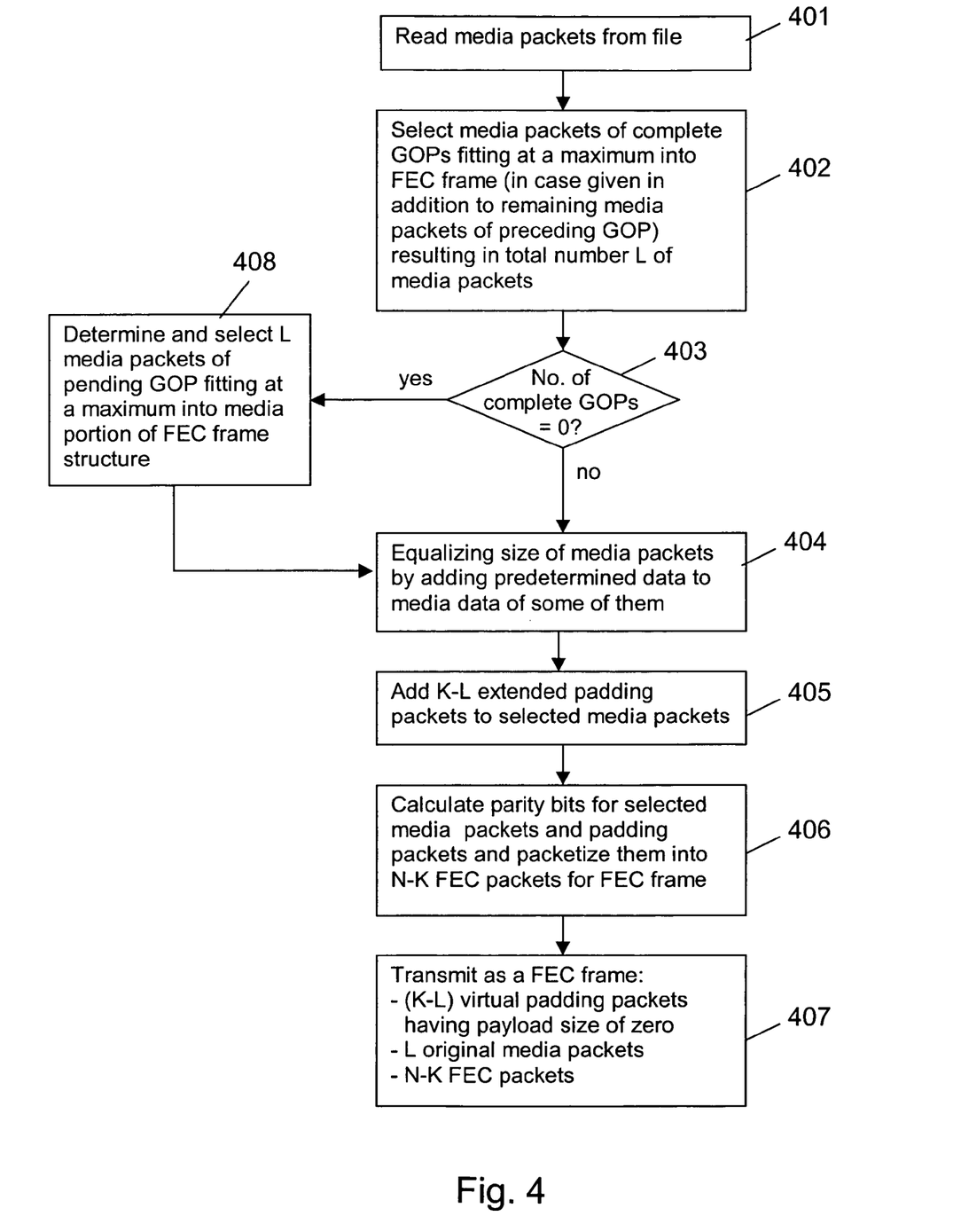
FIG. 4 is a flow chart illustrating a forward error correction encoding in the system of FIG. 1 in accordance with a first embodiment of the invention.

FIG. 4 is a flow chart illustrating an operation by the FEC frame generator 14 of the transmitting device 10 according to the second exemplary embodiment of the invention. In this embodiment, the FEC frame generator 14 has to use a predetermined FEC frame structure. That is, the values N and K are kept constant during the streaming session and signaled out of band.

The FEC frame generator 14 first reads the pre-coded GOP media packets and the associated size information from files 12, 13 in the storage component 11 (step 201).

The FEC frame generator 14 has a knowledge of a minimum and a maximum allowed size of a FEC frame, which are desirable from an application and network statistics point-of-view.

Based on the GOP size information, the FEC frame generator 14 selects the media packets of one or more complete GOPs, which fit into an FEC frame having a size defined by the maximum frame size (step 402). The number of selected media packets is denoted with L.

If media packets of at least one entire GOP fit into an FEC frame (step 403), the FEC frame generator 14 equalizes the size of all selected media packets (step 404), if required, as described above with reference to step 204 of FIG. 2.

If L is smaller than K, the FEC frame generator 14 then adds K-L padding packet to the L selected media packets. (step 405) The padding packets are extended virtual padding packets which have the same size as the equalized media packets in this step and carry a payload of a pre-determined value known at sender and receiver, for example zero.

Next, the FEC frame generator 14 calculates the parity bits for the selected media packets and the padding packets. The parity bits are then packetized into N-K FEC packets. (step 406)

For transmitting the FEC frame via the communication network 19 to the receiving device 15, first K-L virtual padding packets are transmitted. Each of these virtual padding packets has a media payload length of zero bytes, but indicates the size of the padding data of a corresponding padding packet used in the FEC encoding in the RTP payload header, just as the media packets indicate the size of their original media data in the RTP payload headers. Hence those virtual padding packets are very small, when compared to the average size of a media packet, and should not constitute a significant burden to the network. In many network architectures, their size is close to zero when header compression is employed.

The K-L virtual padding packets are followed by the selected L media packets, including only the original media data, as described above with reference to step 207 of FIG. 2. Finally, the N-K FEC packets are transmitted. (step 407).

Like the FEC frame generator 14, the FEC decoder 16 operates again on K media packets having a size corresponding to the size of the largest original media packet. This is achieved by expanding the K-L zero-length virtual padding packets again to full-size padding packets using the padding size information in the RTP payload header and based on predetermined padding bits. Similarly, the L coded media packets are expanded as in step 404 on the encoder side.

The described process can then be continued for the next FEC frame with step 401.

Similarly as in FIG. 2, also in FIG. 4 some situations are considered in addition, which prevent the desired alignment during at least one FEC frame.

If it is detected in some iteration that the media packets of the next GOP do not fit entirely into an FEC frame (step 403), the FEC frame generator 14 selects the first L media packets of the next GOP which fit at a maximum into the FEC frame (step 408). These selected media packets are then processed in steps 404 to 407 as described above.

For the subsequent FEC frame generated in the next iteration, this means that it cannot be ensured that the first media packet of the FEC frame contains the first packet of a GOP. For this subsequent frame, in step 402 a number of media packets of complete GOPs is selected, which fit at a maximum in addition to remaining media packets of a preceding GOP into an FEC frame. The total number remaining media packets and selected media packets is L.

If media packets of at least one next GOP fit entirely into an FEC frame (step 403), steps 404 to 407 are carried out as described above, and the alignment is re-established for the FEC frame constructed in the next iteration.

If media packets of at least one next GOP do not fit entirely into an FEC frame (step 403), all L remaining media packets of the previous GOP are selected which fit at a maximum into the FEC frame (step 408). Then, steps 404 to 407 are carried out as described above. In this case, the alignment will be re-established at the earliest in the next but one iteration.

It will be obvious to a person skilled in the art that other architectures of FEC frames could be used just the same in this second embodiment. For example, the K-L padding packets may be located at the end of the FEC frame, or be interleaved with the media packets. It is not necessary to signal the precise structure of the FEC frame, because padding packets can be identified by their number of media bytes, which is zero, and which is protected using the FEC scheme.

Figure 5:
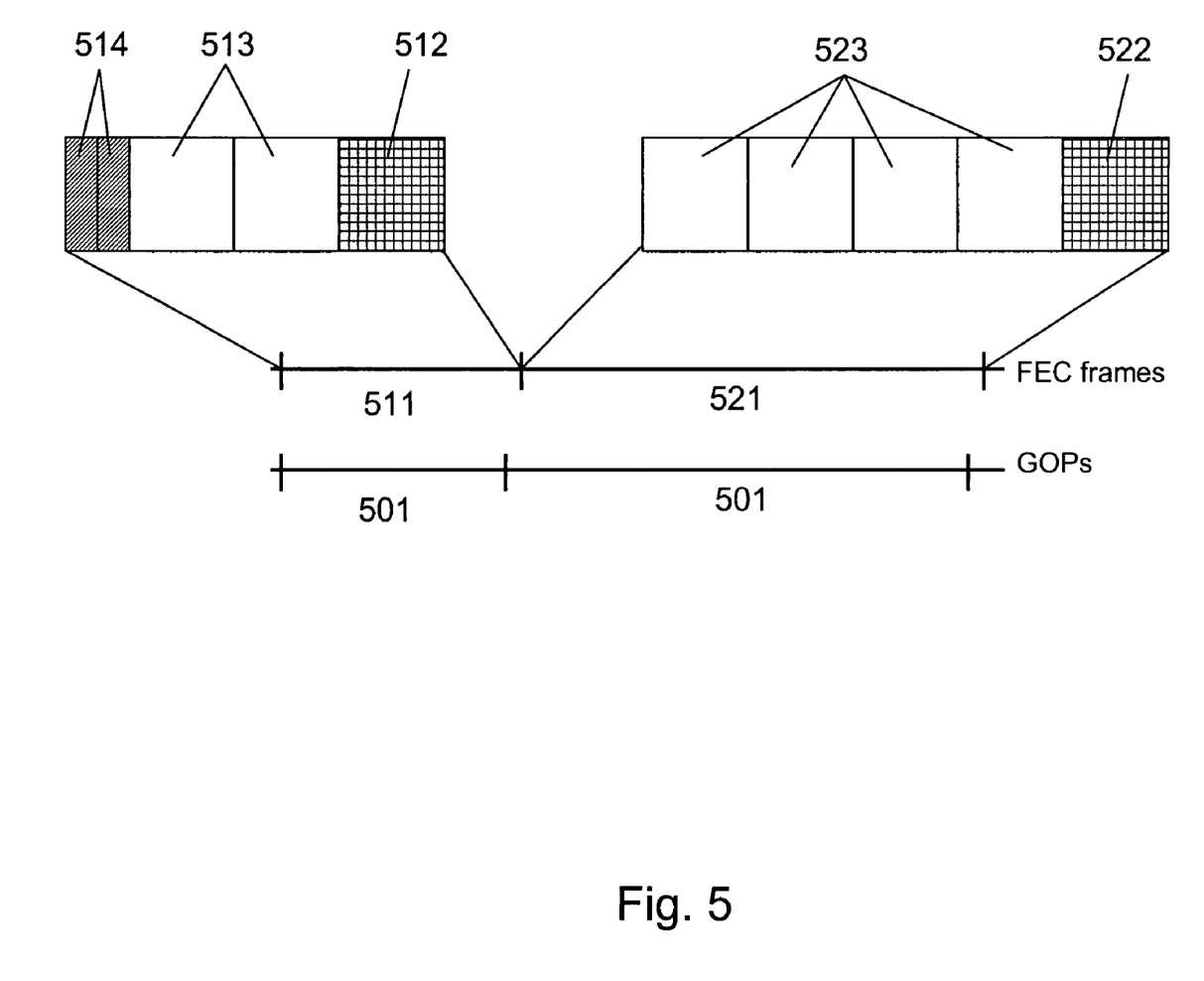
FIG. 5 is a time diagram illustrating the construction of forward error correction frames in the forward error correction of FIG. 4.

FIG. 5 is a timing diagram which illustrate FEC frame structures resulting in the operation described with reference to FIG. 4. The communication network 19 is assumed by way of example to be a fixed rate network.

A first horizontal line represents two media GOPs 501, 502 of different size, and hence different transmission time requirements. Small vertical lines indicate the boundaries of the GOPs 501, 502.

The two GOPs 501, 502 are packetized into two FEC frames 511, 521, which require again different transmission times. A second horizontal line represents both FEC frames 511, 521. Small vertical lines indicate the boundaries of the FEC frames 511, 521.

A more detailed structure of the first FEC frames 511 is illustrated on the left hand side, while a detailed structure of the second FEC frames 521 is illustrated on the right hand side.

Both FEC frames 511, 521 have, in this example, a single FEC packet 512 and 522, respectively. Both FEC frames also have four non-FEC packets; hence K=4.

However, the first FEC frame 511 consists of only two media packets 513 and two very small padding packets 514. The padding packets 514 are generated, for example, using the virtual padding approach described above with reference to FIG. 4.

The second FEC frame 521, in contrast, which carries a much larger GOP 502, consists exclusively of four media packets 523 in addition to the single FEC packet 521.

In spite of the differences, the FEC structure is in both cases such that the value N is equal to five and that the value K is equal to four.

It is to be noted that the described embodiments can be varied in many ways and that they moreover constitute only two of a variety of possible embodiments of the invention. For instance, the algorithm works also for FEC schemes with architectures other than straight-forward Reed-Solomon, for example with all kinds of "matrix" approaches.

What is claimed is:

1. A method for assembling forward error correction frames with coded media packets and at least one forward error correction packet, said method comprising
   selecting coded media packets for a forward error correction frame, each coded media packet including at least one header;
   in case the number of said selected coded media packets is lower than a predetermined number, adding packets comprising padding values as media data in a payload to obtain said predetermined number of coded media packets for said forward error correction frame;
   encoding said coded media packets to obtain said at least one forward error correction packet; and
   replacing said packets comprising padding values for a transmission of said forward error correction frame by virtual padding packets having a payload length of zero bytes and indicating a size of said media data including said padding values in a payload header.

2. The method according to claim 1, wherein selecting coded media packets for a forward error correction frame comprises:
   determining for a sequence of groups of coded media packets a number of next subsequent groups of coded media packets which fit completely into a forward error correction frame and selecting all coded media packets associated to said determined group or groups of coded media packets, if any, for said forward error correction frame.

3. Method according to claim 2, wherein each group of packets comprises in a first packet non-predictively coded media data and in any subsequent packet predictively coded media data.

4. The method according to claim 2, wherein selecting coded media packets for a forward error correction frame further comprises for a case where remaining coded media packets of a group of coded media packets partly included in a preceding forward error correction frame still have to be included in a forward error correction frame, wherein all of said remaining coded media packets fits into a single forward error correction frame:
   determining a number of next subsequent groups of coded media packets which fit, in addition to said remaining coded media packets, completely into a forward error correction frame and selecting said remaining coded media packets and said coded media packets associated to said determined group or groups of coded media packets, if any, for said forward error correction frame.

5. The method according to claim 2, wherein selecting coded media packets for a forward error correction frame further comprises for a case where a next group of coded media data does not fit completely into a forward error correction frame or that all remaining coded media packets of a group of coded media data partly included in a preceding forward error correction do not fit into a single forward error correction frame:
determining a maximum number of next subsequent coded media packets which fit completely into a forward error correction frame and selecting said determined coded media packets for said forward error correction frame.

6. The method according to claim 1, wherein for said encoding, all selected coded media packets are supplemented to be of a same size as a largest one of said selected coded media packets by adding predetermined data to media data included in said selected coded media packets, and wherein each of said obtained at least one forward error correction packet has said size of said largest one of said selected coded media packets.

7. The method according to claim 6, wherein for a transmission of said forward error correction frame, all selected coded media packets are transmitted with an original size of included media data, each coded media packets including an indication of a size of included media data.

8. An apparatus for assembling forward error correction frames with coded media packets and at least one forward error correction packet, said apparatus comprising
a processing component configured to select coded media packets for a forward error correction frame, each coded media packet including at least one header;
a processing component configured to add packets comprising padding values as media data in a payload, in case the number of said selected coded media packets is lower than a predetermined number, to obtain said predetermined number of coded media packets for said forward error correction frame;
a processing component configured to encode said coded media packets to obtain at least one forward error correction packet for said forward error correction frame; and
a processing component configured to replace said packets comprising padding values for a transmission of said forward error correction frame by virtual padding packets having a payload length of zero bytes and to indicate a size of said media data including said padding values in payload header.

9. The apparatus according to claim 8, wherein the apparatus is one of a forward error correction frame generator and a server.

10. A communication system comprising at least one apparatus according to claim 8 and at least one forward error correction decoder.

11. The apparatus according to claim 8, wherein the processing component configured to select coded media packets for a forward error correction frame is configured to determine for a sequence of groups of coded media packets a number of next subsequent groups of coded media packets which fit completely into a forward error correction frame and to select all coded media packets associated to said determined group or groups of coded media packets, if any, for said forward error correction frame.

12. The apparatus according to claim 11, wherein the processing component configured to select coded media packets for a forward error correction frame is further configured for a case that remaining coded media packets of a group of coded media packets partly included in a preceding forward error correction frame still have to be included in a forward error correction frame, wherein all of said remaining coded media packets fits into a single forward error correction frame:
to determine a number of next subsequent groups of coded media packets which fit in addition to said remaining coded media packets completely into a forward error correction frame and to select said remaining coded media packets and said coded media packets associated to said determined group or groups of coded media packets, if any, for said forward error correction frame.

13. The apparatus according to claim 11, wherein the processing component configured to select coded media packets for a forward error correction frame is further configured for a case that a next group of coded media data does not fit completely into a forward error correction frame or that all remaining coded media packets of a group of coded media data partly included in a preceding forward error correction do not fit into a single forward error correction frame:
to determine a maximum number of next subsequent coded media packets which fit completely into a forward error correction frame and to select said determined coded media packets for said forward error correction frame.

14. The apparatus according to claim 11, wherein each group of packets comprises in a first packet non-predictively coded media data and in any subsequent packet predictively coded media data.

15. The apparatus according to claim 8, comprising a processing component configured to supplement for said encoding all selected coded media packets to be of a same size as a largest one of said selected coded media packets by adding predetermined data to media data included in said selected coded media packets, wherein each of said obtained at least one forward error correction packet has said size of said largest one of said selected coded media packets.

16. The apparatus according to claim 15, comprising a processing component configured to transmit said forward error correction frame such that all selected coded media packets are transmitted with an original size of included media data, each coded media packets including an indication of a size of included media data.

17. A computer program product in which a software code for assembling forward error correction frames with coded media packets and at least one forward error correction packet is stored, said software code realizing the following when running in a processing module:
selecting coded media packets for a forward error correction frame, each coded media packet including at least one header;
in case the number of said coded media packets is lower than a predetermined number, adding packets comprising padding values as media data in a payload to obtain said predetermined number of coded media packets for said forward error correction frame;
encoding said coded media packets to obtain said at least one forward error correction packet; and
replacing said packets comprising padding values for a transmission of said forward error correction frame by virtual padding packets having a payload length of zero bytes and to indicating a size of said media data including said padding values in a payload header.

18. An apparatus for assembling forward error correction frames with coded media packets and at least one forward error correction packet, said apparatus comprising means for selecting coded media packets for a forward error correction frame, each coded media packet including at least one header;

means for adding packets comprising padding values as media data in a payload to obtain a predetermined number of coded media packets for said forward error correction frame in case the number of said coded media packets is lower than said predetermined number;

means for encoding said coded media packets to obtain said at least one forward error correction packet; and means for replacing said packets comprising padding values for a transmission of said forward error correction frame by virtual padding packets having a payload length of zero bytes and to indicate a size of said media data including said padding values in payload header.

* * * * *